(12) United States Patent
Hasegawa

(10) Patent No.: US 7,911,794 B2
(45) Date of Patent: Mar. 22, 2011

(54) SEMICONDUCTOR PACKAGE

(75) Inventor: Tsuyoshi Hasegawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/252,072

(22) Filed: Oct. 15, 2008

(65) Prior Publication Data

US 2009/0091891 A1 Apr. 9, 2009

Related U.S. Application Data

(63) Continuation of application No. PCT/JP2008/052571, filed on Feb. 15, 2008.

(30) Foreign Application Priority Data

Feb. 15, 2007 (JP) ................................ 2007-035356

(51) Int. Cl.
*H05K 7/20* (2006.01)

(52) U.S. Cl. ........ 361/700; 361/699; 361/702; 361/710; 165/104.26; 165/104.33; 257/714; 438/122

(58) Field of Classification Search .................. 361/699, 361/700, 702, 679.52, 710, 707, 709, 717, 361/719; 165/80.3, 80.4, 104.33, 104.26, 165/104.21, 185; 257/704, E23.088, 714; 29/600, 610.1, 890.035; 438/122; 174/15.1, 174/15.2; 62/259.2

See application file for complete search history.

(56) References Cited

U.S. PATENT DOCUMENTS

| | | | |
|---|---|---|---|
| 5,998,240 A * | 12/1999 | Hamilton et al. | 438/122 |
| 6,205,022 B1 * | 3/2001 | Bhatia et al. | 361/679.52 |
| 6,847,112 B2 | 1/2005 | Ito | |
| 7,081,670 B2 | 7/2006 | Shibuya et al. | |
| 7,154,753 B2 | 12/2006 | Kobayashi | |
| 7,168,152 B1 * | 1/2007 | Ehret et al. | 29/600 |
| 7,190,054 B2 | 3/2007 | Ishiyama | |
| 7,213,338 B2 * | 5/2007 | Tonosaki et al. | 29/890.035 |
| 7,256,492 B2 | 8/2007 | Kim | |
| 7,352,581 B2 * | 4/2008 | Tomioka | 361/702 |

(Continued)

FOREIGN PATENT DOCUMENTS

JP 2001-144237 A 5/2001

(Continued)

OTHER PUBLICATIONS

U.S. Appl. No. 12/186,129, filed Aug. 5, 2008, Ito, et al.

(Continued)

*Primary Examiner* — Jayprakash N Gandhi
*Assistant Examiner* — Courtney Smith
(74) *Attorney, Agent, or Firm* — Oblon, Spivak, McClelland, Maier & Neustadt, L.L.P.

(57) ABSTRACT

A semiconductor package includes a package main body having a base portion and a semiconductor device accommodating portion, electric terminals electrically connected to a semiconductor device in the accommodating portion and exposed to an outer surface, and a high heat transfer element disposed in the base portion to extend from a heat generation site corresponding position corresponding to a heat generating site of the semiconductor device to a position in an outside of the heat generation site corresponding position. The base portion is configured by bringing a plurality of thin plates in close contact with each other to bond them integrally, and the high heat transfer element includes at least one combination of fluid passage formed in the base portion and a heat transfer fluid sealed in the passage, or at least one heat pipe.

16 Claims, 3 Drawing Sheets

U.S. PATENT DOCUMENTS

| | | |
|---|---|---|
| 7,449,726 B2 | 11/2008 | Nakanishi et al. |
| 7,515,415 B2 * | 4/2009 | Monfarad et al. ............ 361/699 |
| 7,545,033 B2 | 6/2009 | Grant |
| 2007/0187069 A1 | 8/2007 | Ueno et al. |
| 2008/0197462 A1 | 8/2008 | Hasegawa |
| 2008/0286602 A1 | 11/2008 | Hasegawa |
| 2009/0008770 A1 | 1/2009 | Hasegawa |
| 2009/0205806 A1 | 8/2009 | Hasegawa |

FOREIGN PATENT DOCUMENTS

| | | |
|---|---|---|
| JP | 2003-37196 A | 2/2003 |
| JP | 2004-28557 A | 1/2004 |
| JP | 2004-249589 | 9/2004 |
| JP | 2004-288949 A | 10/2004 |
| JP | 2005-175006 | 6/2005 |
| JP | 2005-236276 | 9/2005 |
| JP | 2006-13420 A | 1/2006 |
| JP | 2006-32798 A | 2/2006 |

OTHER PUBLICATIONS

U.S. Appl. No. 12/533,494, filed Jul. 31, 2009, Hasegawa.

U.S. Appl. No. 12/579,023, filed Oct. 14, 2009, Takagi, et al.

* cited by examiner

SEMICONDUCTOR PACKAGE

CROSS REFERENCE TO RELATED APPLICATIONS

This is a Continuation Application of PCT Application No. PCT/JP2008/052571, filed Feb. 15, 2008, which was published under PCT Article 21(2) in Japanese.

This application is based upon and claims the benefit of priority from prior Japanese Patent Application No. 2007-035356, filed Feb. 15, 2007, the entire contents of which are incorporated herein by reference.

BACKGROUND OF THE INVENTION

1. Field of the Invention

This invention relates to a semiconductor package which accommodates a semiconductor device therein.

2. Description of the Related Art

A semiconductor package provided with a package main body including a base portion having a first surface and a second surface positioned on a side opposite to the first surface and a semiconductor device accommodating portion provided on the first surface, in which a semiconductor device is accommodated, and electric terminals provided in the semiconductor device accommodating portion and electrically connected to the semiconductor device accommodated in the semiconductor device accommodating portion and exposed to an outer surface of the semiconductor device accommodating portion, has been conventionally known.

The semiconductor device is formed by mounting a desired circuit pattern on a surface of a substrate formed of substrate material typified by silicon, where a large amount of heat is generated from the circuit pattern during operation of the semiconductor device. When the temperature of the circuit pattern exceeds a certain temperature, the circuit pattern cannot play in a desired performance.

In such a conventional semiconductor package, at least the base portion of the package main body is configured by material with high heat conductivity, for example, copper, aluminum, copper alloy, or aluminum alloy, in order to radiate heat which is generated by the semiconductor device. Heat which is generated by the semiconductor device accommodated in the semiconductor device accommodating portion is transferred to the package main body, mainly to the base portion, and the heat is further radiated to an object with which the package main body, mainly the base portion, comes in contact, for example, a semiconductor package supporting body on which the base portion is placed and supported, air surrounding the package main body, or the like.

In recent years in which high integration of a circuit pattern mounted on a semiconductor device progresses and a heat quantity generated by the semiconductor device increases, various structures for improving heat transfer efficiency of the semiconductor package have been proposed.

Jpn. Pat. Appln. KOKAI Publication No. 2004-288949 discloses one example of the structure for improving heat transfer efficiency such as described above. In a semiconductor package disclosed in Jpn. Pat. Appln. KOKAI Publication No. 2004-288949, a graphite sheet is in close contact with a second surface of a base portion of a package main body. The graphite sheet has high heat conductivity and it rapidly diffuses heat transferred from the second surface of the base portion of the package main body in a direction extending along the second surface, so that heat transfer efficiency from the base portion of the package main body to an object adjacent thereto is enhanced.

Jpn. Pat. Appln. KOKAI Publication No. 2001-144237 discloses another example of the structure for improving heat transfer efficiency such as described above. In this structure for improving heat transfer efficiency, a plurality of graphite sheets and a plurality of sheet metals are alternately stacked on one another. The sheet metal increases a heat transfer amount due to its large heat capacity, while the graphite sheet improves heat radiation from the sheet metal owing to its large heat conductivity.

In the structure for improving heat transfer efficiency described in Jpn. Pat. Appln. KOKAI Publication No. 2004-288949, when the base portion of the package main body of the semiconductor package is fixed to a predetermined position on a surface of a semiconductor package supporting body by screws, the graphite sheet is sandwiched between the second surface of the base portion and the predetermined position on the surface of the semiconductor package supporting body, so that the graphite sheet is brought in close contact with the second surface of the base portion and the predetermined position on the surface of the semiconductor package supporting body.

In the fixation by the screws such as described above, however, evenness of the degree of close contact of the graphite sheet with the second surface of the base portion of the package main body of the semiconductor package and the predetermined position on the surface of the semiconductor package supporting body is reduced easily. That is, heat transfer efficiency from the second surface of the base portion to the predetermined position on the surface of the semiconductor package supporting body becomes uneven easily on these surfaces. In addition, heat transfer efficiency of the graphite sheet in a thickness direction thereof is smaller than that in a direction along the surface of the graphite sheet.

In the structure for improving heat transfer efficiency described in Jpn. Pat. Appln. KOKAI Publication No. 2004-288949, therefore, sufficient cooling effect cannot be exerted to increase of heat quantity generated by a semiconductor device in recent years.

In the structure for improving heat transfer efficiency described in Jpn. Pat. Appln. KOKAI Publication No. 2001-144237, the plurality of graphite sheets and the plurality of sheet metals alternately stacked to one another are mutually brought in close contact with one another and fixed to one another by screws, glue, or adhesive.

Because of increase in the number of graphite sheets which are used and use of the plurality of sheet metals, the structure for improving heat transfer efficiency described in Jpn. Pat. Appln. KOKAI Publication No. 2001-144237 is improved in radiation efficiency as compared with the structure for improving heat transfer efficiency described in Jpn. Pat. Appln. KOKAI Publication No. 2004-288949. In the fixation by the screws, glue, or adhesive as described above, however, such a fact that evenness of the degree of mutual close contact between the plurality of graphite sheets and the plurality of sheet metals is reduced easily remains. That is, mutual heat transfer efficiency between the plurality of graphite sheets and the plurality of sheet metals becomes uneven easily. Further, the heat transfer efficiency of the graphite sheet in the thickness direction is smaller than that in the direction along the surface of the graphite sheet.

Accordingly, in the structure for improving heat transfer efficiency described in Jpn. Pat. Appln. KOKAI Publication No. 2001-144237, sufficient cooling performance cannot be played to the increase in heat quantity generated by the semiconductor device in recent years. Since the thickness of each of the plurality of sheet metals mutually fixed to the plurality of graphite sheets by the screws, glue or adhesive is relatively large, the thickness of the abovementioned structure becomes relatively large.

BRIEF SUMMARY OF THE INVENTION

According to one aspect of the present invention, a semiconductor package comprises: a package main body including a base portion having a first surface and a second surface on a side opposite to the first surface, and a semiconductor device accommodating portion provided on the first surface, in which a semiconductor device is accommodated; electric terminals provided in the semiconductor device accommodating portion, electrically connected to the semiconductor device, and exposed to an outer surface of the semiconductor device accommodating portion; and a high heat transfer element having a heat conductivity higher than that of the base portion, disposed in the base portion to extend from a heat generation site corresponding position corresponding to a heat generating site of the semiconductor device to a position in an outside of the heat generation site corresponding position, and transferring heat generated from the heat generating site of the semiconductor device from the heat generation site corresponding position to the outside position in the base portion. The base portion is configured by bringing a plurality of thin plates in close contact with each other to bond the thin plates to each other integrally, and the high heat transfer element includes at least one combination of a flow passage extending from the heat generation site corresponding position to the outside position in the base portion and heat transfer fluid sealed in the flow passage to transfer heat by phase-change thereof.

According to another aspect of the present invention, a semiconductor package comprises: a package main body including a base portion having a first surface and a second surface on a side opposite to the first surface, and a semiconductor device accommodating portion provided on the first surface, in which a semiconductor device is accommodated; electric terminals provided in the semiconductor device accommodating portion, electrically connected to the semiconductor device, and exposed to an outer surface of the semiconductor device accommodating portion; and a high heat transfer element having a heat conductivity higher than that of the base portion, disposed in the base portion to extend from a heat generation site corresponding position corresponding to a heat generating site of the semiconductor device to a position in an outside of the heat generation site corresponding position, and transferring heat generated from the heat generating site of the semiconductor device from the heat generation site corresponding position to the outside position in the base portion. The base portion is configured by bringing a plurality of thin plates in close contact with each other to bond the thin plates to each other integrally, and the high heat transfer element includes at least one heat pipe configured independently of the base portion and arranged in the base portion so as to extend from the heat generation site corresponding position to the outside position.

DETAILED DESCRIPTION OF THE INVENTION

First Embodiment

Figure 1:
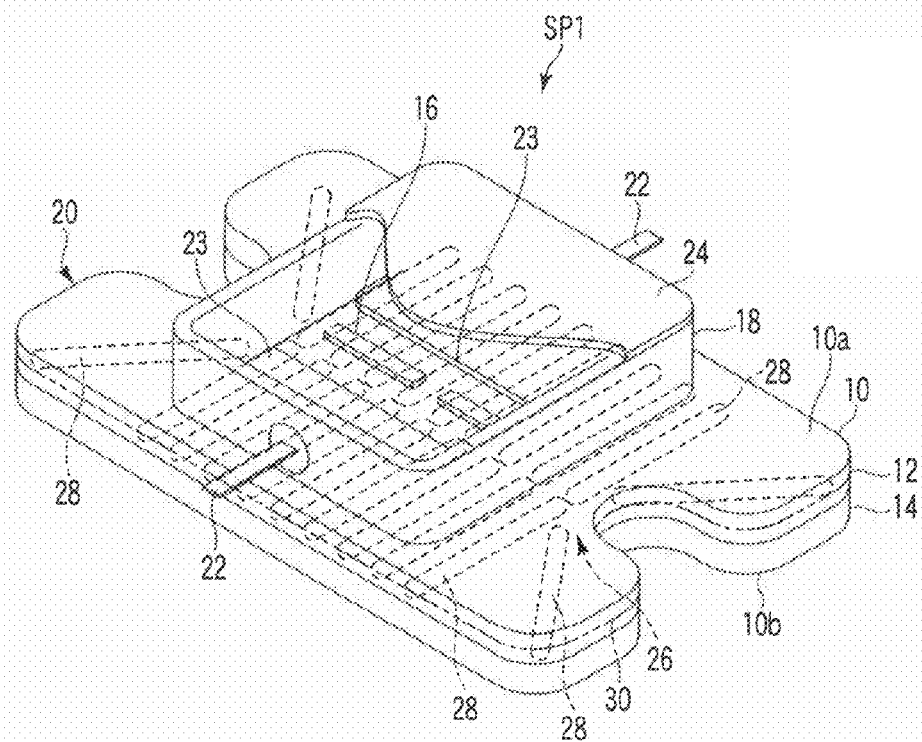
FIG. 1 is a schematic perspective view showing a semiconductor package according to a first embodiment of this invention, where a part of a lid of a semiconductor accommodating portion of a package main body is cut off.
Figure 2:
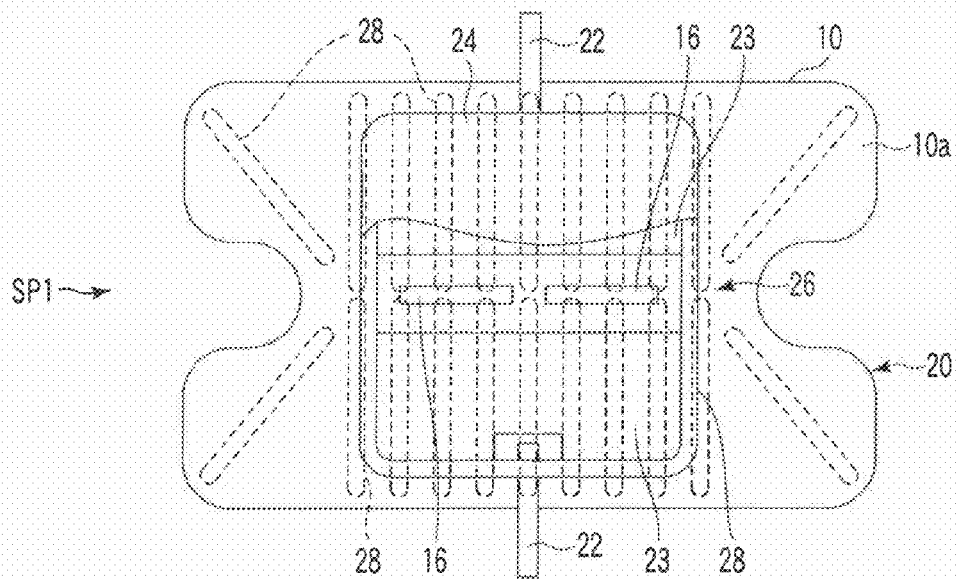
FIG. 2 is a schematic plan view of the semiconductor package of FIG. 1.

A configuration of a semiconductor package SP1 according to a first embodiment of the present invention will be explained with reference to FIG. 1 and FIG. 2.

The semiconductor package SP1 according to the first embodiment is provided with a package main body 20 including a base portion 10 having a first surface 10a and a second surface 10b positioned on a side opposite to the first surface 10a and configured by bringing a plurality of thin plates 12, 14 in close contact with each other and bonding (for example, diffusion bonding) them integrally, and a semiconductor device accommodating portion 18 which is provided on the first surface 10a and in which semiconductor devices 16 are accommodated.

The semiconductor device accommodating portion 18 is provided with electric terminals 22 electrically connected to the semiconductor devices 16 accommodated in the semiconductor device accommodating portion 18, and exposed to an outer surface of the semiconductor device accommodating portion 18.

In this embodiment, peripheral circuit mounting boards 23 each provided with a peripheral circuit for the semiconductor device 16 are also accommodated in the semiconductor device accommodating portion 18, and the semiconductor devices 16 are connected to the electric terminals 22 via wires on the peripheral circuit mounting boards 23.

Specifically, the plurality of thin plates 12, 14 are made of metal material having high heat conductivity (for example, it may includes copper, aluminum, copper alloy, aluminum alloy, or metal material having heat conductivity approximately equal to those of the materials, the heat conductivity of copper being about 400 W/mK). In FIG. 1, only two thin plates 12, 14 are shown, but the number of thin plates brought in close contact with one another mutually to be integrally bonded to configure the base portion 10 may be more than two in accordance with the aspect of the present invention.

The semiconductor device accommodating portion 18 has a cylindrical shape providing an internal space accommodating the semiconductor devices 16 and peripheral circuit mounting boards 23 provided with peripheral circuits relating to the semiconductor devices 16, and surrounding a predetermined region of the first surface 10a of the base portion 10. The semiconductor devices 16 and the peripheral circuit mounting boards 23 are placed on the predetermined region of the first surface 10a. The semiconductor device accommodating portion 18 includes a lid 24 covering an opening opposite to the predetermined region of the first surface 10a of the base portion 10. The lid 24 covers the opening after the semiconductor devices 16 and the peripheral circuit mounting boards 23 are placed on the predetermined region of the first surface 10a and mutual connections among the semiconductor devices 16, the peripheral circuit mounting boards 23, and the electric terminals 22 are finished, so that the internal space is sealed from the outside space.

A high heat transfer element 26 having heat conductivity higher than that of the base portion 10 is provided in the base portion 10, the high heat transfer element 26 being arranged in the base portion 10 from a heat generating site corresponding position corresponding to heat generating sites of the semiconductor devices 16 accommodated in the semiconductor device accommodating portion 18 (a region adjacent to the heat generating sites of the semiconductor devices 16 on the first surface 10a of the base portion 10) to a position in the outside of the heat generating site corresponding position, in the outside of the semiconductor device accommodating portion 18 in this embodiment. The high heat transfer element 26 transfers heat generated by the heat generating sites of the semiconductor devices 16 to the outside position from the heat generation site corresponding position in the base portion 10.

In this embodiment, the high heat transfer element 26 includes at least one combination of a flow passage 28 extending from the heat generating site corresponding position up to the outside position in the base portion 10 and heat transfer fluid sealed in the flow passage 28 and transferring heat by its phase change.

The heat transfer fluid absorbs heat from the semiconductor devices 16 at the heat generation site corresponding position in the base portion 10 and changes its phase from liquid to gas, and then flows up to the outside position in the flow passages 28 by its convection. The heat transfer fluid gasified and flown by convection radiates heat at the outside position which is far from the heat generating site corresponding position and whose temperature is lower than that of the heat generating site corresponding position, and changes its phase to liquid, and then flows to the heat generating site corresponding position in the flow passage 28. As such heat transfer fluid, various kinds of ones have been widely known.

The thin plates 12, 14 of the base portion 10 have openings each of which has a shape corresponding to the flow passage 28, and they are brought in close contact with each other and bonded to each other integrally in a state that the at least parts of openings are overlapped with each other. The flow passages 28 configured in the base portion 10 in this manner can be easily provided in the base portion 10 with various numbers and various arrangements. That is, it is possible to transfer heat from the heat generating site corresponding position to a desired outside position in the base portion 10 effectively.

When the quantity of heat generated by the semiconductor device 16 increases, a possibility that crack or break occurs in the substrates of the semiconductor devices 16, the peripheral circuit mounting boards 23, or the both thereof due to differences in the coefficients of the thermal expansions between the substrate (generally, made of silicon) of the semiconductor device 16 or the peripheral circuit mounting board 23 (generally, made of ceramic) and the base portion 10 becomes large. In order to prevent the substrate of the semiconductor device 16, the peripheral circuit mounting board 23, or the both thereof from being cracked or broken, at least one thin sheet 30 having a coefficient of thermal expansion equal to or less than the coefficient of thermal expansion of the substrate of the semiconductor device 16 or the peripheral circuit mounting board 23 can be included in the plurality of thin plates configuring the base portion 10. As a material for the thin plate 30, for example, molybdenum is known. The thickness or the shape of such a thin plate 30 or arrangement of the thin plate 30 in the base portion 10 is set such that an occurrence of crack or break in the substrate of the semiconductor device 16, the peripheral circuit mounting board 23, or the both thereof due to the difference in the coefficients of thermal expansions can be prevented and a desired heat transfer function of the base portion 10 is not reduced.

Modification of First Embodiment

Next, a semiconductor package SP1' according to a modification of the first embodiment described above with reference to FIG. 1 and FIG. 2 will be explained with reference to FIG. 3.

In this modification, the same structural members as those in the semiconductor package SP1 of the first embodiment described above with reference to FIG. 1 and FIG. 2 are designated by the same reference numerals as those designating the structural members corresponding thereto in the semiconductor package SP1 of the first embodiment and detailed explanations thereof are omitted.

The modification is different from the first embodiment in that a ratio of each area of a first surface 10'a and a second surface 10'b of a base portion 10' to that of the semiconductor device accommodating portion 18 is largely expanded as compared with a ratio of each area of the first surface 10a and the second surface 10b of the base portion 10 to the semiconductor device accommodating portion 18 in the package main body 20 according to the first embodiment, in order to increase a radiation function of the base portion 10' of the package main body 20. Further, the number of combinations of flow passages 28' and heat transfer fluids sealed in the flow passages 28' in the high heat transfer element 26 of the base portion 10' and/or the arrangement density of the combinations and/or an extending length of each combination is increased in response to the expansion of each area of the first surface 10'a and the second surface 10'b of the base portion 10'.

Here, in addition to the expansion of each area of the first surface 10'a and the second surface 10'b of the base portion 10', increase in the number of combinations of the flow passages 28' and the heat transfer fluids sealed in the flow passages 28' in the high heat transfer element 26 and/or in the arrangement density of the combinations and/or in the extending length of each combination in the base portion 10' largely increases the radiation function of the base portion 10'.

Also in this modification, like in the case of the semiconductor package SP1 according to the first embodiment described above with reference to FIG. 1 and FIG. 2, in order to prevent the substrate of the semiconductor device 16, the peripheral circuit mounting board 23, or the both thereof from being cracked or broken by the differences in the coefficients of the thermal expansions between the substrate (generally, made of silicon) of the semiconductor device 16 or the peripheral circuit mounting board 23 (generally, made of ceramic) and the base portion 10, at least one thin sheet 30 having a coefficient of thermal expansion equal to or less than the coefficient of thermal expansion of the substrate of the semiconductor device 16 or the peripheral circuit mounting board 23 can be included in the plurality of thin plates configuring the base portion 10'.

Figure 3:
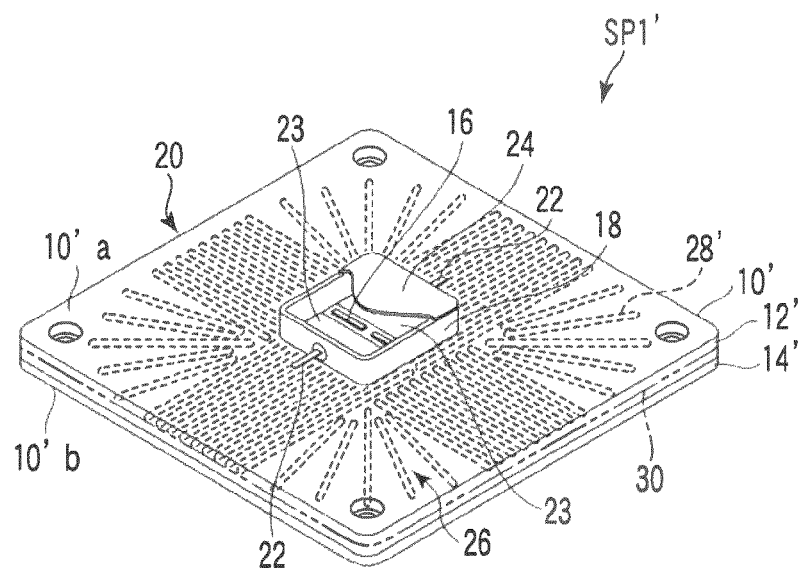
FIG. 3 is a schematic perspective view showing a semiconductor package according to a modification of the first embodiment shown in FIGS. 1 and 2, where a part of a lid of a semiconductor accommodating portion of a package main body is cut off.
Figure 4:
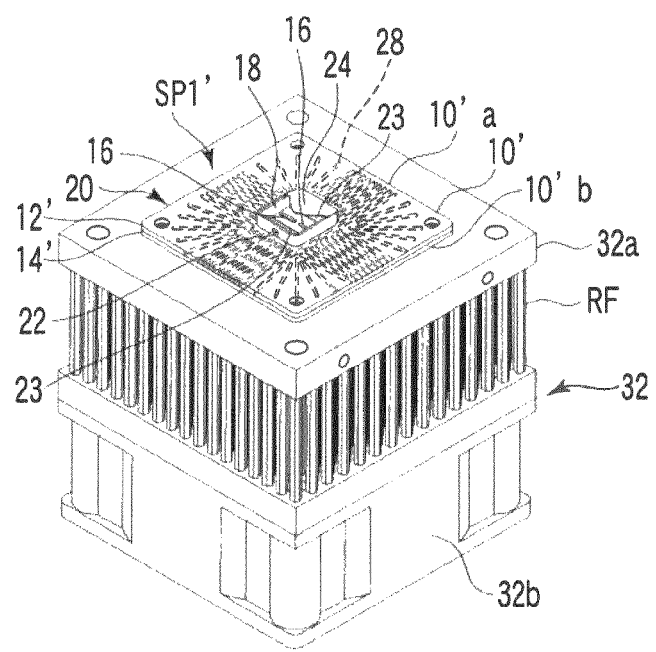
FIG. 4 is a schematic perspective view showing the semiconductor package according to the modification shown in FIG. 3 in combination with a conventional radiation performance enhancing mechanism.

In order to further enhance the radiation function of the base portion 10' of the package main body 20, the semiconductor package SP1' according to the modification of FIG. 3 can be combined with a conventional radiation performance enhancing mechanism 32 as shown in FIG. 4.

The radiation performance enhancing mechanism 32 shown in FIG. 4 includes a semiconductor package supporting body 32a, on which the second surface 10'b of the base portion 10' of the package main body 20 of the semiconductor package SP1' is placed in a close contacting state with the semiconductor supporting body 32a, and a cooling fan 32b blowing air toward the semiconductor package supporting body 32a, and the base portion 10' of the package main body 20 of the semiconductor package SP1' is fixed to the semiconductor package supporting body 32a by known fixing means, for example, fixing screws, preferably fixing screws made of metal having high heat conductivity (for example, copper, aluminum, copper alloy, aluminum alloy, or metal material having heat conductivity approximately equal to those of these materials), or soldering.

Figure 5:
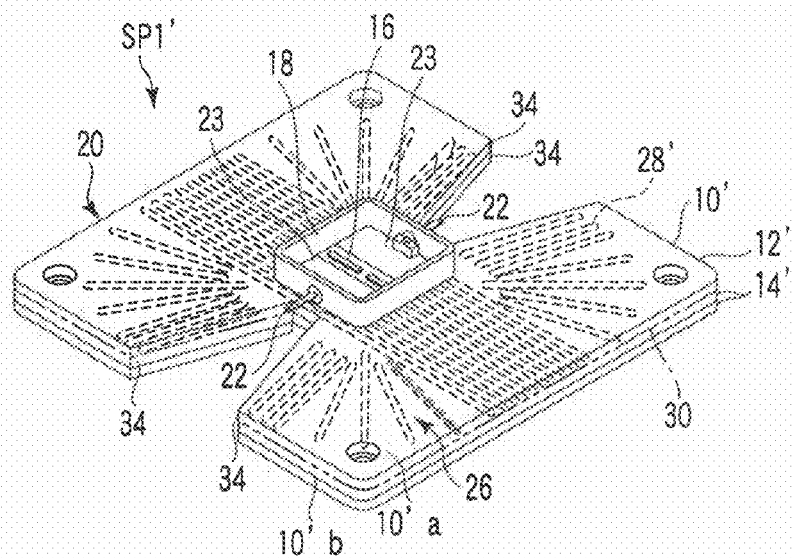
FIG. 5 is a schematic perspective view of the semiconductor package according to the modification shown in FIG. 3 with a small change.

In the semiconductor package SP1' according to the modification of FIG. 3, each area of the first surface 10'a and the second surface 10'b of the base portion 10' is expanded. In this case, there is a possibility that it is difficult to connect wires (not shown) to exposed portions of the electric terminals 22 of the semiconductor package accommodating portion 18. In order to clear this problem, cutouts 34 can be formed in a plurality of thin plates 12' and 14' of the base portion 10' of the semiconductor package SP1' according to the modification of FIG. 3 to extend along extension lines of the exposed portions of the electric terminals 22 in the outside of the semiconductor device accommodating portion 18, as shown in FIG. 5. Naturally, the flow passages 28' for the high heat transfer element 26 are not formed in regions of the base portion 10' where the cutouts 34 are formed.

Second Embodiment

Figure 6:
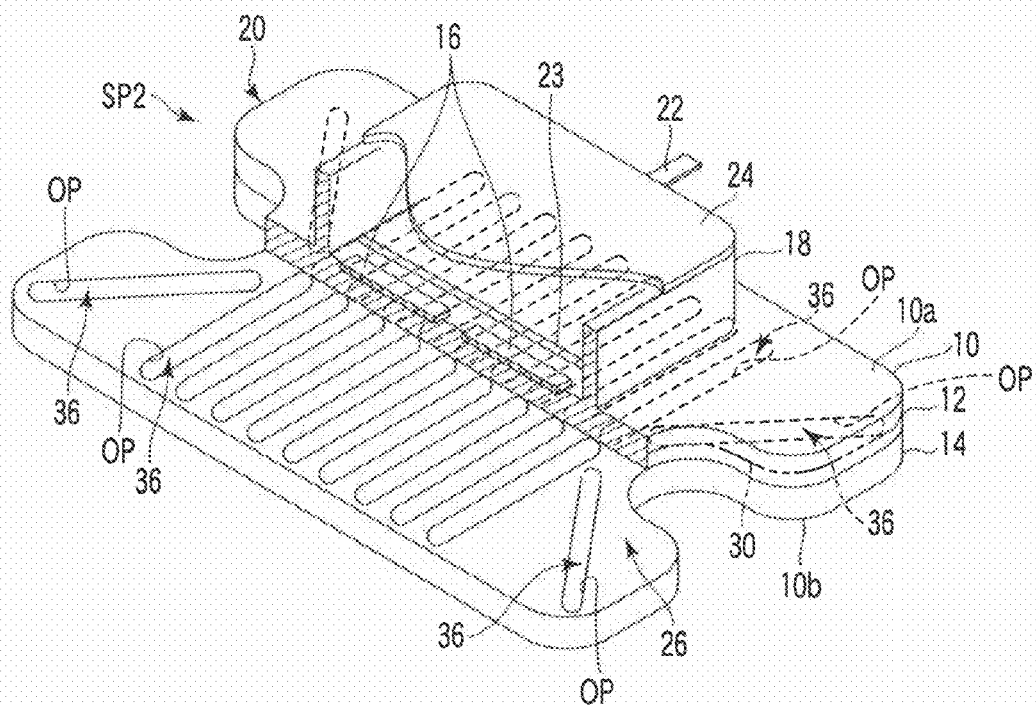
FIG. 6 is a schematic perspective view showing a semiconductor package according to a second embodiment of this invention, where a semiconductor accommodating portion of a package main body and a base portion are partially cut off.

Next, a semiconductor package SP2 according to a second embodiment of the present invention will be explained with reference to FIG. 6.

In this embodiment, the same structural members as those in the semiconductor package SP1 of the first embodiment described above with reference to FIG. 1 and FIG. 2 are designated by the same reference numerals as those designating the structural members corresponding thereto in the semiconductor package SP1 of the first embodiment and detailed explanations thereof are omitted.

This embodiment is different from the first embodiment in that the high heat transfer element 26 is configured independently of the base portion 10 and includes at least one heat pipe 36 arranged in the base portion 10 to extend from the abovementioned heat generating site corresponding portion to the abovementioned outside position.

Each of the thin plates 12, 14 of the base portion 10 has a opening OP with a shape corresponding to the heat pipe 36, and the thin plates 12, 14 are brought in close contact with each other and integrally bonded to each other in a state that the openings OP are overlapped with each other.

The heat pipe 36 also stores heat transfer fluid in its pipe main body 36a. The heat transfer fluid in the pipe main body 36a absorbs heat from the semiconductor device 16 at the heat generating site corresponding position in the base portion 10 and changes its phase from liquid to gas, and then flows up to the outside position in the pipe main body 36a by convection. The heat transfer fluid gasified and flown by the convection radiates heat at the outside position which is far from the heat generating site corresponding position and whose temperature is lower than that of the heat generating site corresponding position, and changes its phase from gas to liquid, and then flows to the heat generating site corresponding position in the pipe main body 36a. As such heat transfer fluid, various kinds of ones have been widely known.

The heat pipes 36 can be easily provided in the base portion 10 in various numbers and various arrangements. That is, it is possible to transfer heat from the heat generating site corresponding position to a desired outside position in the base portion 10 effectively.

What is claimed is:

1. A semiconductor package comprising:
   a package main body including a base portion having a first surface and a second surface on a side opposite to the first surface, and a semiconductor device accommodating portion provided on the first surface, in which a semiconductor device is accommodated;
   electric terminals provided in the semiconductor device accommodating portion, electrically connected to the semiconductor device, and exposed to an outer surface of the semiconductor device accommodating portion; and
   a plurality of high heat transfer elements, each heat transfer element having a heat conductivity higher than that of the base portion, disposed in the base portion to extend from a heat generation site corresponding position corresponding to a heat generating site of the semiconductor device to a position in an outside of the heat generation site corresponding position, transferring heat generated from the heat generating site of the semiconductor device from the heat generation site corresponding position to the outside position in the base portion,
   the base portion being configured by bringing a plurality of thin plates in close contact with each other to bond the thin plates to each other integrally,
   each of the high heat transfer elements being independent from the base portion, and including a combination of a closed and elongated flow passage extending from the heat generation site corresponding position to the outside position in the base portion and heat transfer fluid sealed in the flow passage to transfer heat by phase-change thereof,
   each closed and elongated flow passage including a proximal end located in or near the heat generation site corresponding position, and a distal end located in the outside position, and
   the proximal ends of the closed and elongated flow passages surrounding the heat generation site corresponding position.

2. The semiconductor package according to claim 1, wherein
   the thin plates of the base portion have openings each shape of which corresponds to the flow passage, and the thin plates are brought in close contact with each other and are integrally bonded to each other in a state that the openings are partially overlapped with each other.

3. The semiconductor package according to claim 1, wherein
   the thin plates of the base portion include at least one thin plate having a coefficient of thermal expansion equal to or lower than that of a substrate of the semiconductor device.

4. The semiconductor package according to claim 1, wherein
   a peripheral circuit mounting board for the semiconductor device is further accommodated in the semiconductor device accommodating portion, and
   the thin plates of the base portion include at least one thin plate having a coefficient of thermal expansion equal to or lower than that of a substrate of the semiconductor device or the peripheral circuit mounting board.

5. A semiconductor package comprising:
a package main body including a base portion having a first surface and a second surface on a side opposite to the first surface, and a semiconductor device accommodating portion provided on the first surface, in which a semiconductor device is accommodated;
electric terminals provided in the semiconductor device accommodating portion, electrically connected to the semiconductor device, and exposed to an outer surface of the semiconductor device accommodating portion; and
a plurality of high heat transfer elements, each heat transfer element having a heat conductivity higher than that of the base portion, disposed in the base portion to extend from a heat generation site corresponding position corresponding to a heat generating site of the semiconductor device to a position in an outside of the heat generation site corresponding position, and transferring heat generated from the heat generating site of the semiconductor device from the heat generation site corresponding position to the outside position in the base portion,
the base portion being configured by bringing a plurality of thin plates in close contact with each other to bond the thin plates to each other integrally,
each of the high heat transfer elements including a heat pipe configured independently of the base portion and arranged in the base portion so as to extend from the heat generation site corresponding position to the outside position,
each heat pipe including a proximal end located in or near the heat generation site corresponding position, and a distal end located in the outside position, and
the proximal ends of the heat pipes surrounding the heat generation site corresponding position.

6. The semiconductor package according to claim 5, wherein
the thin plates of the base portion have openings each of which has a shape corresponding to the heat pipe, and the thin plates are brought in close contact with each other and are bonded to each other in a state that the respective openings are overlapped with each other.

7. The semiconductor package according to claim 5, wherein
the thin plates in the base portion include at least one thin plate having coefficient of thermal expansion equal to or lower than that of a substrate of the semiconductor device.

8. The semiconductor package according to claim 5, wherein
a peripheral circuit mounting board for the semiconductor device is further accommodated in the semiconductor device accommodating portion, and
the thin plates of the base portion include at least one thin plate having a coefficient of thermal expansion equal to or lower than that of a substrate of the semiconductor device or the peripheral circuit mounting board.

9. The semiconductor package according to claim 1, wherein
the heat generation site corresponding position is long and narrow, and
the proximal ends of the closed and elongated flow passages are arranged along both longitudinal sides of the heat generation site corresponding position.

10. The semiconductor package according to claim 9, wherein
the closed and elongated flow passages with their proximal ends are arranged near or in both longitudinal ends of the heat generation site corresponding position.

11. The semiconductor package according to claim 1, wherein
the heat generation site corresponding position has a four-sided shape, and
the proximal ends of the closed and elongated flow passages are arranged along at least two-opposed sides of the heat generation site corresponding position.

12. The semiconductor package according to claim 1, wherein
the heat generation site corresponding position has a four-sided shape, and
the proximal ends of the closed and elongated flow passages are arranged along the four sides of the heat generation site corresponding position.

13. The semiconductor package according to claim 5, wherein
the heat generation site corresponding position is long and narrow, and
the proximal ends of the heat pipes are arranged along both longitudinal sides of the heat generation site corresponding position.

14. The semiconductor package according to claim 11, wherein
the heat pipes with their proximal ends are arranged near to or in both longitudinal ends of the heat generation site corresponding position.

15. The semiconductor package according to claim 5, wherein
the heat generation site corresponding position has a four-sided shape, and
the proximal ends of the heat pipes are arranged along at least two-opposed sides of the heat generation site corresponding position.

16. The semiconductor package according to claim 5, wherein
the heat generation site corresponding position has a four-sided shape, and
the proximal ends of the heat pipes are arranged along the four sides of the heat generation site corresponding position.

* * * * *